United States Patent [19]
Sekibata et al.

[11] Patent Number: 4,580,713
[45] Date of Patent: Apr. 8, 1986

[54] METHOD FOR BONDING AN ALUMINUM WIRE

[75] Inventors: Masao Sekibata, Kunitachi; Kanji Otsuka, Higashiyamato; Yoshiyuki Ohzawa, Hiratsuka, all of Japan

[73] Assignee: Hitachi, Ltd., Tokyo, Japan

[21] Appl. No.: 535,055

[22] Filed: Sep. 23, 1983

[30] Foreign Application Priority Data

Oct. 4, 1982 [JP] Japan ................. 57-173230

[51] Int. Cl.$^4$ ............................ B23K 20/10
[52] U.S. Cl. .................... 228/111; 228/110; 228/205; 219/91.21
[58] Field of Search ............ 228/1, 45, 110, 111, 228/179, 205; 219/91.21; 174/52 FP; 427/117, 126.3–126.4

[56] References Cited

U.S. PATENT DOCUMENTS

| 2,021,477 | 11/1935 | Bohn | 219/91.21 |
| 2,754,456 | 7/1956 | Madelung | 427/126.4 X |
| 3,259,558 | 7/1966 | Hagiwara et al. | 427/126.4 X |
| 3,717,842 | 2/1973 | Douglas | 228/1 R |
| 3,822,465 | 7/1974 | Frankort et al. | 228/111 |
| 4,056,681 | 11/1977 | Cook | 174/52 FP |
| 4,279,666 | 7/1981 | Micheli | 427/126.4 X |
| 4,373,653 | 2/1983 | Salzer et al. | 228/110 X |

OTHER PUBLICATIONS

*The Formation of Metal Oxide Films Using Gaseous and Solid Electrolytes*, Journal of the Electrochemical Society, J. L. Miles and P. H. Smith, vol. 12, p. 1240, Dec. 1963.

Primary Examiner—Kenneth J. Ramsey
Assistant Examiner—M. Jordan
Attorney, Agent, or Firm—Antonelli, Terry & Wands

[57] ABSTRACT

A method for bonding an aluminum wire to a minute pad of an electronic circuit by an ultrasonic bonding technique. An anodized aluminum wire having its surface subjected to insulating coating is used. The bonding is effected such that this anodized aluminum wire is pressed against the pad by means of a wedge and, while a load is being thereby applied to the wire, ultrasonic vibrations are caused in the wedge. The alumite is exfoliated from the base material by application of the load and ultrasonic energy to the wire, and this base material and pad are bonded together at this exfoliated portion.

4 Claims, 5 Drawing Figures

METHOD FOR BONDING AN ALUMINUM WIRE

BACKGROUND OF THE INVENTION

The present invention relates to a method of bonding a wire to a pad of an electronic circuit and, more particularly, to a method of bonding a number of aluminum wires to a very small area such as that in a hybrid module.

An electronic circuit module such as, for example, a hybrid module is constructed such that semiconductor pellets are mounted upon a multi-layer ceramic module. In the electronic module, it is often necessary to modify the wiring due to changes or errors in the design of the module. When modifying the module, it is impossible to renew the wiring of the module per se each time such modification is made and, in such situations the bonding technique employing an engineering change pad (EC pad) which is provided on the module and onto which discrete wires are attached, is adopted. A procedure of this type is described in, for example, "Precise Numerical Control for the Thermal Conduction Module" by M. A. Sanborn of IBM J. Res. Den. (Vol. 27. No. 1). Wires employed with the engineering pads must have a small diameter with a higher strength and conductivity than usually employed, and have an insulation coated thereto.

Conventionally, a copper wire is used as the wire satisfying the necessary requirements, with the copper wire being plated with Au for preventing a deterioration of bonding due to oxidization and also has its surface thereof coated with an insulating film of a resin such as, for example, TEFLON, polyurethane, etc.

A general method of bonding proposes removing the insulation film by ultrasonic waves and thereafter to effect a bonding by thermocompression-bonding. However, a disadvantage of this general method resides in the fact that the coated wire becomes thick thereby enlarging the bonding area. Further, the proposed method entails a two step operation; namely, removing the coated film and then performing the thermocompression bonding, thereby increasing the overall processing time. Moreover, the removal of the coated film as a whole is difficult and, consequently reliability of the bonding is low. These disadvantages are not limited to the wire bonding for engineering change, but can generally be involved whenever wire bonding is effected with respect to very small areas.

The object of the present invention is to provide a method capable of bonding wires with high reliability in very small areas.

The smaller the bonding area for wires, the smaller the wire diameter is necessary and, to this end, the coating on the wire is preferably small in thickness. In the bonding method according to the present invention the working efficiency increases when the coating removal and the bonding can be carried out at the same time. Further, it is preferable from the viewpoint of reliability that no coating residue is left on the bonding section. To meet these demands, the present invention is arranged such that, while a load is being applied onto an anodized aluminum wire by pressing the same against a pad by means of a wedge, ultrasonic vibrations are imparted to this wedge, thereby effecting the bonding of the wire.

The above and other objects, features, and advantages of the present invention will become more apparent from the following description when taken in connection with the accompanying drawings which show, for the purposes of illustraton only, one embodiment in accordance with the present invention.

DETAILED DESCRIPTION

Figure 1:
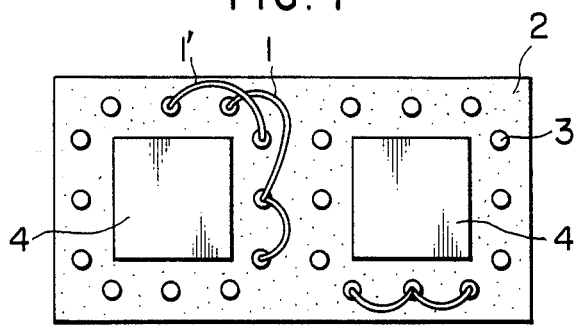
FIG. 1 is a plan view of a hybrid module to which the method of the present invention is applied.
Figure 2:
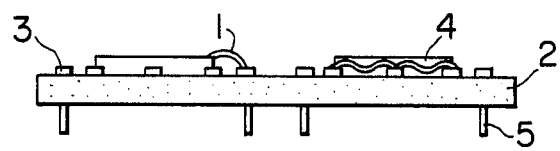
FIG. 2 is a side view of the module of FIG. 1.

Referring now to the drawings wherein like reference numerals are used throughout the various views to designate like parts and, more particularly, to FIGS. 1 and 2, according to these figures module board 2 includes a multilayer circuit board formed of, for example, alumina-ceramic material and has two semiconductor pellets 4 mounted thereon and is also attached, at the back face, with leads 5 for enabling an external connection. Engineering change pads 3 are disposed at a periphery of the pellets 4, with the pads 3 each having their surfaces provided thereon with Au-plating to a thickness of 1 to 2 $\mu$m. Wires for engineering change 1 and 1' are bonded to some of the pads 3. To one pad 3, one or two wires are bonded. Occasionally, the wires 1, 1' intersect and may be in contact with each other and therefore are required to be insulated.

Figure 3:
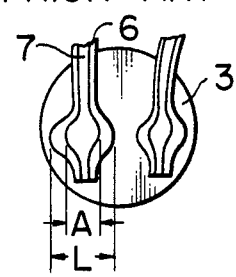
FIG. 3 is a schematic view of a module of the prior art example.

FIG. 3 shows two conventional wires provided with insulation coating bonded, to the pad 3. In FIG. 3, a Cu core wire 7 is provided with the Au plating, and an insulation coating 6 of, for example, a resin such as TEFLON, polyurethane or the like. When the core wire 7 has an outer diameter of 50 $\mu$m dia., the insulation coating 6 is 5 to 10 $\mu$m in thickness and as a result, the outer diameter of the wire has a diameter of between 60 to 70 $\mu$m. Since the Cu core wire 7 is hard and therefore can be only slightly deformed as compared with Au or Al, the ultrasonic bonding carried out under the application of a load to the core wire can not be effected unless the ultrasonic output, the duration of application of the ultrasonic waves and the load applied are increased. However, when such output, duration and load are increased, the metal at the junction layer is broken resulting in a reduction of the bonding strength. For this reason, it is better to utilize an Au-Au diffused junction by thermocompression bonding because such junction layer is not broken and the resultant bonding strength is high. In the prior art, however, ultrasonic waves are first applied for removing the coating, whereby part of the wire has its insulating coating 6 removed by its friction with respect to the pad 3. Then, the wire is pressure-bonded to the pad 3 under a load of 200 to 500 g by means of a tip heated up to 400° to 500° C. According to this prior art bonding method, the bonding portion has the insulating coating 6 crushed and is enlarged to a size of three to four times the original wire size to have a width as great as 280 $\mu$m (=70×4) as shown in FIG. 3 by a reference numeral L. This enlargement problem requires the use of a large pad. Futhermore, the insulating coating 6 after being melted remains in the vicinity of the bonding portion, with the insulating coating 6 entering the bonding portion to cause a decrease in the bonding strength as well as to stain the area in the vicinity of the bonding portion.

Experiments were performed on various wires, with the results of the experiments being compared in order to solve the above-mentioned problems encountered in the prior art. As a result of the experiments it was determined that an anodized aluminum wire is suitable for satisfying the various requirements and yet brings about good effects. Where a wire is applied to a hybrid module, shown in FIG. 1, it is desirable in view of the strength and conductivity of a core wire per se that the diameter thereof be in the range of 30 to 60 μm. When a core wire of aluminum has a diameter of 50 μm dia. and thickness of the alumite is in the range of 0.1 to 1 μm dia., an insulating characteristic of $1 \times 10^8$ Ω or more is obtained and the outer diameter of the wire need only have a diameter of approximately 51 μm dia. On the other hand, the bonding of thi anodized aluminum wire is possible with a mere application thereto of ultrasonic vibrations under a load and requires no complicated procedure as in the prior art bonding method.

Figure 4:
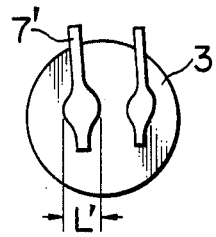
FIG. 4 is a view for explaining the present invention.
Figure 5:
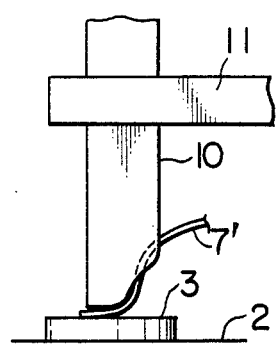
FIG. 5 is a partially schematic side view of a main part of a bonding means.

In FIG. 4, two wires 7' are bonded to the pad 3 in accordance with the present invention. In FIG. 5, the wire 7' is pressed against the pad 3 by application of a load with the use of a wedge 10, and ultrasonic vibrations are exerted through the wedge 10 by a phone 11. In bonding, the wire is first pressed by the wedge 10 without applying any ultrasonic vibration thereto, and ultrasonic vibrations are then imparted thereto. If the pressing of the wire 7' were to be started while ultrasonic vibrations are being applied, the wire 7' would be displaced or moved, resulting in a failure to press the wire with high precision.

The bonding was carried out under the following conditions with the use of the anodized aluminum wire having a diameter of 50 μm and an alumite thickness of 1 μm.

| | |
|---|---|
| Ultrasonic Frequency | 60 KHz ±3% |
| Duration of Application of the Ultrasonic Bivrations | 0.4 second |
| Ultrasonic Output | 0.04 W |
| Load | 40 g |

According to this experiment, the width L' of the crushed wire is 1.5 to 2 times the diameter of the non-crushed aluminum wire and, even in the case of 2 times, 102 μm (=51×2), which is one half or less of the width of the conventional bonding area. Generally, the bonding strength needs to be at least 30% of the tensile strength of a wire per se. While, according to the invention, the tensile strength of the aluminum wire per with a diameter of 50 μm was about 28 g, the bonding strength amounted to a value equal to or greater than that value.

Alumite is hard and fragile. Therefore, if the aluminum, as a base material, is deformed and spread by application of ultrasonic energy and pressure upon bonding, the alumite is broken and is exfoliated from the aluminum base material and the bonding is effected to the pad at this exfoliated portion. Alumite is easily separated, in this way, from the base material unlike the prior art coated resin. Alumite, therefore, has less undesirable effects upon the bonding and besides does not strain the area neighbouring upon the bonding portion. The aluminum wire has a sufficiently high bonding reliability up to 500° C. Therefore, it is possible to sufficiently maintain its bonding reliability even when, after bonding, heat is applied to it in the case of, for example, soldering, etc.

With a anodized aluminum wire having a diameter in the range of 30 to 60 μm, the bonding may be effected under the same bonding conditions as mentioned above except for the load. Namely, a range of between 0.35 sec and 0.45 sec, mainly 0.4 sec is preferable for the duration of applying the ultrasonic vibrations, and a range between 0.035 W and 0.045 W, mainly 0.04 W is preferable for the ultrasonic output. With regard to the load, the smaller the diameter of the core wire 7, the smaller or lower the load. Accordingly, the load of 18 to 45 g is desirable. Particularly, the load can be around 40 g where the wire diameter is in a range of between 50 to 60 μm, and the load may be around 20 g where the wire diameter is as small as between 30 to 40 μm. When the bonding was carried out under these bonding conditions, the bonding strength had a value greater than that corresponding to 30% of the tensile strength of the anodized aluminum wire per se. Where the application time duration, output, and load are respectively smaller in value than mentioned above, the bonding becomes insufficient. Where the application time duration, output and load are greater in value than mentioned above, the metal at the bonding portion is broken with the result that the bonding strength decreases.

If, as mentioned above, the ultrasonic wire bonding is carried out with the use of the anodized aluminum wire, the use of even the wire having a diameter of 51 μm makes it possible sufficiently to bond two wires to the pad 3 where the diameter thereof has a diameter of approximately 0.4 mm. Further, the heat resistant capability thereof is maintained, satisfactorily and therefore, the aluminum wire can withstand a soldering or other heating operation as well. In addition, if the portion involved in the bonding section is hermetically sealed after this distribution of the engineering change wires, the wire is prevented from being broken due to erosion and have a longer service life. Recently, products having aluminum wire bonded thereto are subjected to supercleaning for removing the substances such as halogen ions ($F^-$, $Cl^-$, $Br^-$ or the like) or other substance which are capable of eroding the aluminum wire, to thereby obtain the bonding reliability with the use of resin sealing only. With this procedure (resin sealing), it is of course possible to obtain the bonding reliability.

What is claimed is:

1. A method for bonding a wire to a pad of an electronic circuit, the method comprising the steps of:
   preparing an anodized aluminum wire to be used as said wire, said aluminum wire having a diameter in a range of between 30 to 60 μm; and, pressing said anodized aluminum wire against said pad by a wedge and, while applying a load to said anodized aluminum wire, subjecting said wedge to ultrasonic vibrations, thereby effecting a bonding of said aluminum wire to said pad, said ultrasonic vibrations are imparted after said aluminum wire is pressed against the pad by said wedge and is thereby applied with a load, a duration in which the ultrasonic vibrations are applied is in a range of between 0.35 to 0.45 seconds, an ultrasonic output is in a range of between 0.035 to 0.045 W, and the load applied is in a range of between 18 to 45 g.

2. A method according to claim 1, wherein an ultrasonic frequency of the ultrasonic vibrations is approximately 60 kHz.

3. A method of bonding a wire to a pad of an electronic circuit, the method comprising the steps of preparing an anodized aluminum wire having a diameter in a range of between 30 to 60 μm to be used as said wire; pressing said aluminum wire against said pad by a wedge so as to apply a load in a range of between 18 to 45 g to said aluminum wire; and subjecting said wedge to ultrasonic vibrations for a time period in a range of between 0.35 to 0.45 seconds.

4. A method according to claim 5, wherein an ultrasonic frequency of the ultrasonic vibrations is approximately 60 kHz.

* * * * *